(12) United States Patent
Kaneda

(10) Patent No.: US 8,014,210 B2
(45) Date of Patent: Sep. 6, 2011

(54) NON-VOLATILE MEMORY CONTROL CIRCUIT

(75) Inventor: Yoshinobu Kaneda, Gunma-ken (JP)

(73) Assignee: Semiconductor Components Industries, LLC, Phoenix, AZ (US)

( * ) Notice: Subject to any disclaimer, the term of this patent is extended or adjusted under 35 U.S.C. 154(b) by 269 days.

(21) Appl. No.: 12/480,143

(22) Filed: Jun. 8, 2009

(65) Prior Publication Data

US 2009/0303800 A1    Dec. 10, 2009

(30) Foreign Application Priority Data

Jun. 6, 2008   (JP) .................................. 2008-148844

(51) Int. Cl.
*G11C 11/34* (2006.01)
(52) U.S. Cl. ........... 365/185.29; 365/185.01; 365/185.3; 365/185.32; 365/185.33
(58) Field of Classification Search ............. 365/185.01, 365/185.29, 185.3, 185.32, 185.33
See application file for complete search history.

(56) References Cited

U.S. PATENT DOCUMENTS

| 6,134,147 A | 10/2000 | Kaneda | |
| 2006/0291305 A1* | 12/2006 | Suzuki et al. | 365/200 |
| 2008/0273405 A1* | 11/2008 | Byun et al. | 365/200 |

FOREIGN PATENT DOCUMENTS

JP       11328985 A     11/1999

* cited by examiner

*Primary Examiner* — Pho M Luu
*Assistant Examiner* — Tha-O Bui
(74) *Attorney, Agent, or Firm* — Cantor Colburn LLP

(57) ABSTRACT

An efficient erasure is performed. The voltage of a source line SL is manipulated in units of a sector providing a plurality of memory cells. An erase command is received for the desired memory cells to be erased in a plurality of word line WL units arranged within a sector and all data within the sector, which includes the desired memory cells to be erased, is saved in a separate memory. Erasure is then performed for the entire sector, and among the saved data the data outside the desired memory cells to be erased is returned to the memory cells.

3 Claims, 3 Drawing Sheets

NON-VOLATILE MEMORY CONTROL CIRCUIT

CROSS-REFERENCE TO RELATED APPLICATION

The entire disclosure of Japanese Patent Application No. 2008-148844 including specification, claims, drawings and abstract is incorporated herein by reference in its entirety.

BACKGROUND OF THE INVENTION

1. Field of the Invention

The present invention relates to a non-volatile memory control circuit for controlling erasure of non-volatile memory where source line voltage is manipulated in units of a sector composed of a predetermined plurality of memory cells.

2. Description of the Related Art

Heretofore, flash memory has become widely popular as non-volatile memory to which data can be rewritten. Data erasure in flash memory is accomplished by applying a high voltage HV to a word line (WL) and removing electrons held in a floating gate (FG) of the memory.

On the other hand, in a programming operation for writing data, a high voltage is applied to the source line. Since the high voltage is also applied to memory cells that are not to be programmed, electrons enter the floating gate (FG) in accordance with the total application time of the high voltage and may cause a transfer to a program state, namely, a program disturb may occur, such as due to reverse tunneling phenomenon. When the program disturb occurs, data cannot be normally retrieved during read operations.

Consequently, when rewriting data to flash memory, erasure is performed in sector units formed from a plurality of memory cells of the same source line after which programming is performed. As a result, both erasure and programming are performed at the same sector unit so as to prevent the non-retrieval of normal data during read operations due to the influence of program disturb.

Japanese Patent Laid-Open Publication No. Hei 11-328985 discloses the related art.

Here a sector is a relatively large unit resulting in a problem where an entire sector must be erased and a large amount of data must be exchanged to rewrite data even when it is desirable to erase only a small amount of data.

Furthermore, the life of flash memory is often determined by the number of erasures. There is also a demand to decrease the number of erasures in cellular telephones where the data rewrite frequency of flash memory is extremely high.

SUMMARY OF THE INVENTION

The present invention relates to a non-volatile memory control circuit for controlling erasure of non-volatile memory where source line voltage is manipulated in units of a sector composed of a predetermined plurality of memory cells. An erase command is received for memory cells to be erased of one or a plurality of word line units arranged within a sector, all data within the sector including the desired area to be erased is saved to another memory, erasure is performed for the entire sector, and among the saved data, the data of the memory cells not of the desired area to be erased is returned to the corresponding memory cells. Therefore, with the erase unit as the memory cell unit in common with word line, an effective erasure can be performed.

Furthermore, during erasure, on the basis of the voltage of the saved data read from memory cells within the sector, it is judged whether deterioration of the voltage is greater than or equal to a predetermined amount. If it is judged the deterioration of the voltage is not greater than or equal to the predetermined amount, it is preferable to perform erasure of only the memory cells to be erased of the sector. Here, deterioration of the voltage greater than or equal to the predetermined amount refers to a state immediately or a little prior to the state in the normal read operation where the desired data cannot be read, where the voltage of a set level approaches to some extent that of an opposite level compared to the initial voltage.

DETAILED DESCRIPTION OF THE PREFERRED EMBODIMENTS

Embodiments of the present invention will be described hereinafter with reference to the attached drawings.

Figure 1:
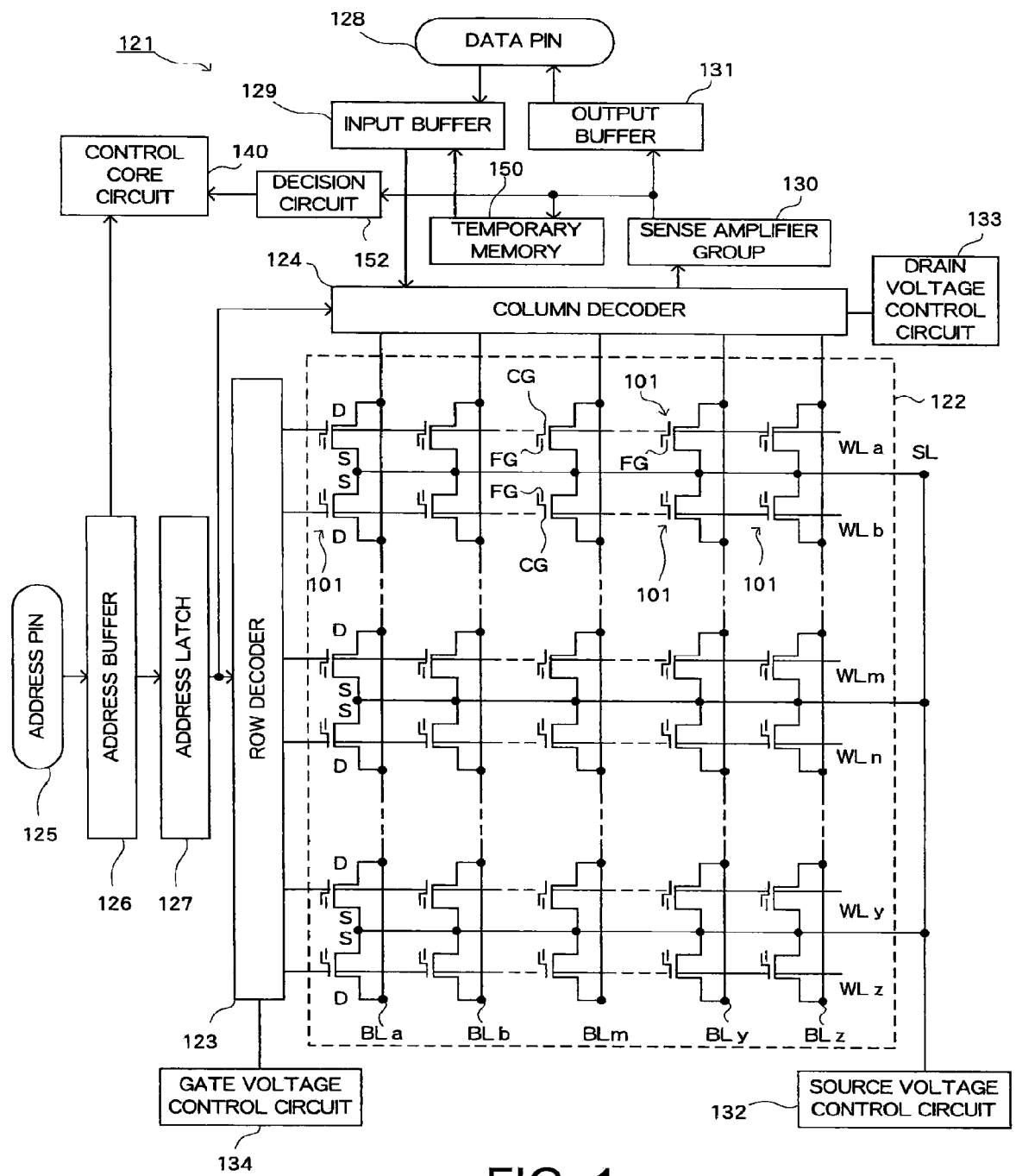
FIG. 1 is a block diagram showing an overall configuration of a flash memory.

FIG. 1 shows an overall configuration of a flash EEPROM 121. Each memory cell 101 utilizes a split gate non-volatile semiconductor memory cell 101 including a source S, a channel CH, a drain D, a floating gate FG, and a control gate CG formed on a semiconductor substrate.

A sector 122, which is one set of unit memory cells, is composed of a plurality of memory cells 101 arranged in a matrix configuration. To control gates CG of memory cells 101 arranged in rows are respectively connected common word lines WLa to WLz. To drains D of memory cells 101 arranged in columns are respectively connected common bit lines BLa to BLz. Sources S of all memory cells 101 are connected to a common source line SL.

Word lines WLa to WLz are connected to a row decoder 123 and bit lines BLa to BLz are connected to a column decoder 124.

A row address and a column address applied from an external source are input by an address pin 125. The row address and column address are transferred from the address pin 125 to an address latch 127 via an address buffer 126. Among the addresses latched by the address latch 127, the row address is transferred to the row decoder 123 and the column address is transferred to the column decoder 124.

The row decoder 123 selects a word line WLa to WLz corresponding to the row address latched by the address latch 127 and connects the selected word line to a gate voltage control circuit 134.

The column decoder 124 selects a bit line BLa to BLz corresponding to the column address latched by the address latch 127 and connects the selected bit line to a drain voltage control circuit 133. Furthermore, the source line SL is connected to a source voltage control circuit 132.

The gate voltage control circuit 134 controls the voltage of the word line connected via the row detector 123, the drain voltage control circuit 133 controls the voltage of the bit line connected via the column decoder 124, and the source voltage control circuit 132 controls the source line SL voltage to correspond to an operating mode.

The operating modes include write, erase, read, standby, and so forth. For example, during write the word line is 2 V and the source line is 10 V, during erase the word line is 12 V and during read the word line is 4 V and the bit line is 2 V, and basically 0 V otherwise.

During program operation (write), data from an external source is input by a data pin 128. The data is transferred from the data pin 128 to the column decoder 124 via an input buffer 129. The column decoder 124 controls the voltage of the selected bit line as described hereinabove in accordance with the data and the program operation is performed.

During the read operation, the data read from the specific memory cell 101 is transferred from bit lines BLa to BLz to a sense amplifier group 130 via the column decoder 124. The sense amplifier group 130 is composed of a plurality of sense amplifiers (not shown). The column decoder 124 connects the selected bit line to the respective sense amplifier. Data distinguished by the sense amplifier group 130 is output from an output buffer 131 via the data pin 128.

The word line and bit line are selected by the row address and column address supplied from an external source to determine the memory cell to be written to or read from.

Heretofore, during an erase operation, with the memory cell array sector 122 connected to the source line SL as one unit, all existing word lines WL are set to a predetermined high voltage (for example, 15 V) and the electrons held in the floating gates (FG) of all memory cells 101 were removed. Namely, erasure was performed in sector units.

On the other hand, the embodiment performs erasure in word line WL units. Namely, a command is received from an external source for performing erasure corresponding to a word line among word lines WLa to WLz. Therefore, an external CPU supplies an address specifying an area corresponding to the word line and that area is erased.

In the embodiment, the output of the sense amplifier group 130 is also connected to a temporary memory 150, composed such as from SRAM. The read out data can then be saved in the temporary memory 150. Furthermore, the output of the sense amplifier group 130 is also supplied to the decision circuit 152 to determine whether or not a program disturb phenomenon is occurring with respect to the signal read out from each of the memory cells 101. Moreover, the temporary memory 150 is also connected to the input buffer 129 and the data held in the temporary memory 150 can be written to the corresponding memory cells 101.

The program operation, the read operation, and the erase operation are controlled by a control core circuit 140.

Figure 2:
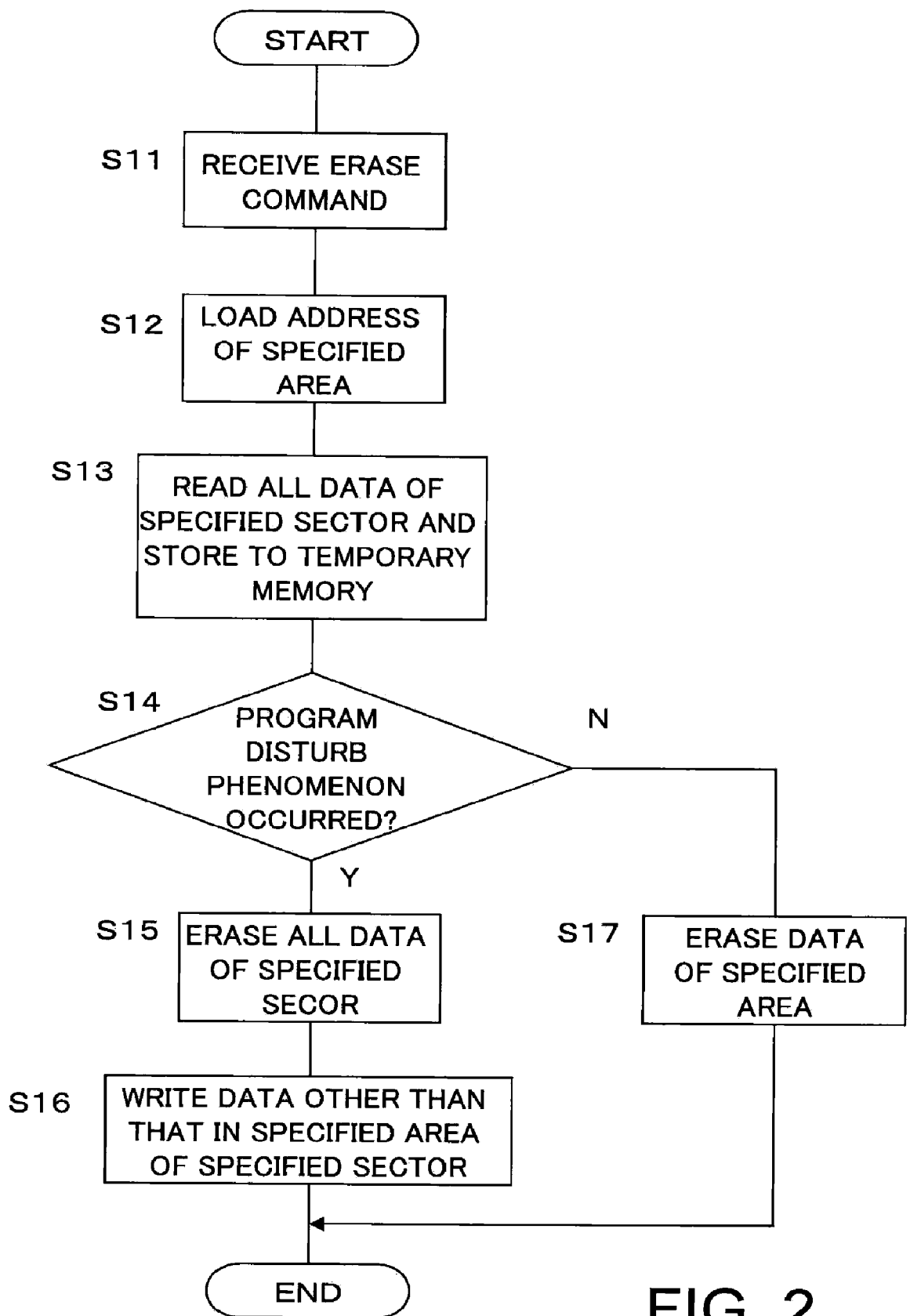
FIG. 2 is a flowchart showing an operation during erasure.

Next, the erase operation in the embodiment will be described with reference to FIG. 2. This operation is basically performed by the control core circuit 140.

First, in the case of erasure, the control core circuit 140 receives an erase command from the external CPU (S11). For example, the erase command is supplied to the control core circuit 140 via a control bus. The erase command is received and the control core circuit 140 acquires an address specifying a desired area to be erased from the address buffer 126 (S12). The desired area to be erased is the memory cells 101 connected to one word line in one sector. Generally, the desired area to be erased is specified by a predetermined number of most significant bits of the address specifying the respective memory cells.

The control core circuit 140 specifies the corresponding sector 122 from the acquired address specifying the desired area to be erased, sequentially reads the data of the respective memory cells 101 within the sector 122, and stores to the temporary memory 150 (S13).

Furthermore, the signals read from the memory cells 101 and output from the sense amplifier group 130 are sequentially supplied to the decision circuit 152. Namely, the output from the sense amplifier group 130 is supplied in parallel to both the temporary memory 150 and the decision circuit 152. The output of the sense amplifier group 130 is a voltage signal read from the memory cells 101. At the output buffer 131 and the temporary memory 150 a value of either "1" or "0" is stored in accordance with the output of the sense amplifier group 130. On the other hand, from the voltage value of the signal the decision circuit 152 determines whether or not a program disturb phenomenon is occurring. For example, immediately after writing, with the read voltage of "1" of the sense amplifier group 130 at Va and the read voltage of "0" at 0 V, when the read voltage is within a range of 0.3 Va to 0.7 Va, it is determined that the program disturb phenomenon is occurring. It is preferable to determine that the program disturb phenomenon is occurring when the signal voltage is within the above-mentioned range even for one memory cell. Processing to exclude defective memory cells is performed separately from the present processing and it is assumed such memory cells are not subject to the present processing. Furthermore, additional criterion may be employed, such as if 10 or more memory cells are within ranges of 0.25 to 0.3 Va or 0.70 to 0.75 Va, the program disturb phenomenon is determined to be occurring.

If it was determined the program disturb phenomenon is occurring in the result at the decision circuit 152, an overall erase operation for the sector 122 wherein the desired area to be erased exists is performed (S15). The program disturb phenomenon here refers to a state immediately or a little prior to the state in the normal read operation where the desired data cannot be read, where the voltage is in a deteriorated state approaching an opposite level of a predetermined extent compared to the initial voltage in accordance with a written data.

If the program disturb phenomenon has been confirmed, all data is deleted by setting all word lines within the sector 122 to a high voltage. In this case, data for the memory cells 101 outside the desired area to be erased is stored in the input buffer 129 from the temporary memory 150 and this data is written to the memory cells 101 outside the desired area to be erased within the sector (S16). Write control is also performed by the control core circuit 140. Therefore, the external CPU instructs the erasure of the desired area to be erased so only the erasure of the desired area to be erased appears to have been performed.

On the other hand, if the result of S14 is NO, erasure of only the desired area to be erased is performed (S17). Namely, the row decoder 123 only selects the desired word line WL and erasure of only the desired area to be erased is performed by setting the word line WL to a high voltage for erasure. In this manner, erasure is performed according to instruction by the CPU in S17.

In this manner, according to the embodiment, in the case where the program disturb phenomenon is not occurring, erasure of only the memory cells 101 in common with the word line WL is performed. Therefore, the erasure can be performed in relatively small area units so that unnecessary erasures are reduced and the number of erasures of the memory cells 101 can be reduced. As a result, the life of the flash memory 121 can be extended.

It is also possible to specify memory cells connected to a plurality of word lines as a desired area to be erased from an external source. In this case, it is understood that single word lines are specified a plurality of times.

Figure 3:
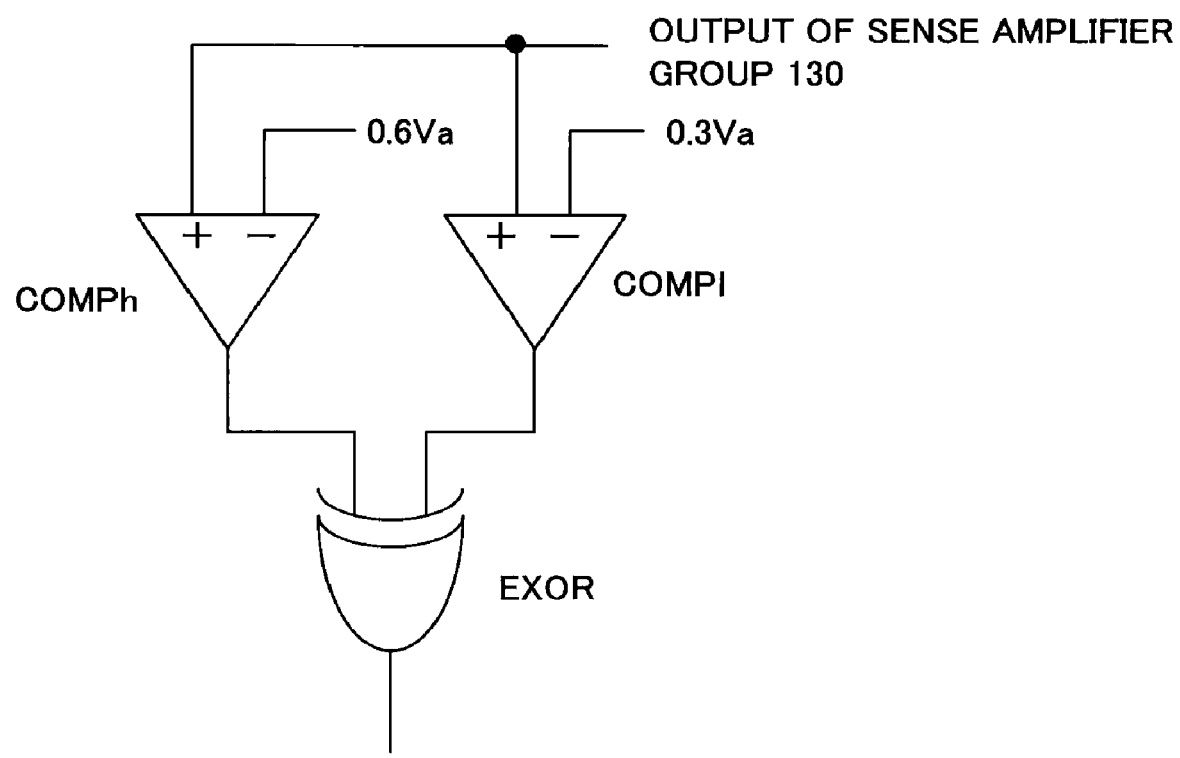
FIG. 3 is a block diagram showing a configuration of a decision circuit 152.

FIG. 3 shows an example of a configuration of the decision circuit 152, which includes two comparators COMP1 and COMPh. The positive input terminal of the comparator COMP1 inputs the output of the sense amplifier group 130 and the negative input terminal inputs 0.3 Va as a threshold voltage. Furthermore, the positive input terminal of the comparator COMPh inputs the output of the sense amplifier group 130 and the negative input terminal inputs 0.7 Va as a threshold voltage. The outputs of the two comparators COMP1 and COMPh are input by an exclusive OR (EXOR) gate.

Therefore, the EXOR gate inputs H and H when the output of the sense amplifier group 130 is 0.7 Va or higher, L and L when the output is 0.3 Va or lower, and L and H when the output is 0.3 Va to 0.7 Va. For this reason, the output of the EXOR gate is H when the sense amplifier group 130 is 0.3 Va to 0.7 Va.

Then, when the output of the EXOR gate becomes H, the decision circuit 152 sets a flag indicating that the program disturb phenomenon has occurred so that the control core circuit 140 can be informed of the decision result.

While there has been described what are at present considered to be preferred embodiments of the invention, it will be understood that various modifications may be made thereto, and it is intended that the appended claims cover all such modifications as fall within the true spirit and scope of the invention.

What is claimed is:

1. A non-volatile memory control circuit for controlling the erasure of non-volatile memory, said non-volatile memory is divided into sectors, each sector includes a plurality of memory cells; memory cells within one sector are controlled by one source line with a source voltage in common; and memory cells within one sector are divided and connected to a plurality of word lines;

said non-volatile memory control circuit receives an erase command for a desired area to be erased with memory cells connected to part of a plurality of word lines disposed within the sector as a unit;

data of all memory cells within the sector including the desired area to be erased is saved to a separate memory;

erase is performed for the entire sector;

among the saved data, data outside the desired memory cells to be erased is returned to the corresponding memory cells.

2. A non-volatile memory control circuit according to claim 1, wherein:

the desired area to be erased is memory cells connected to one word line.

3. A non-volatile memory control circuit according to claim 1, wherein:

during erase, on the basis of voltage of data read from memory cells within the sector that was saved, it is judged whether or not deterioration of voltage is greater than or equal to a predetermined amount; and according to this judgment if the deterioration of the voltage is judged to be less than or equal to the predetermined amount, erase is performed only on the desired memory cells to be erased of the sector and if the deterioration of the voltage is judged to be more than the predetermined amount, erase is performed on the whole memory cells of the sector.

* * * * *